United States Patent
Von Arx et al.

[15] 3,691,707
[45] Sept. 19, 1972

[54] SEMICONDUCTOR MATERIAL CUTTING APPARATUS AND METHOD OF MAKING THE SAME

[72] Inventors: Henry R. Von Arx, Palo Alto; Karl J. Zueger, San Rafael, both of Calif.

[73] Assignee: Sola Basic Industries

[22] Filed: Nov. 12, 1969

[21] Appl. No.: 876,000

[52] U.S. Cl. ........................51/206, 51/281, 51/293, 29/523, 83/13, 156/17, 204/49, 125/15

[51] Int. Cl. .......B24d 5/00, B24d 11/10, B24d 17/00

[58] Field of Search ..51/206, 309, 295, 293; 30/347; 125/15; 144/235; 85/5, 6, 8

[56] References Cited

UNITED STATES PATENTS

| | | | |
|---|---|---|---|
| 2,894,583 | 7/1959 | Johnstad | 30/347 X |
| 3,491,740 | 1/1970 | Kohlstrunk | 51/206 R X |
| 3,501,280 | 3/1970 | Myers | 51/309 X |

*Primary Examiner*—Othell M. Simpson
*Attorney*—Smythe & Moore

[57] ABSTRACT

Improved rotary cutting apparatus and method of making the same incorporates a thin deposited layer of diamond particles in nickel disposed about the periphery of a rotatably body. The deposited layer is exposed beyond the periphery of the body during the fabrication process to provide high-speed cutting apparatus for use on semiconductor materials.

4 Claims, 5 Drawing Figures

INVENTORS
HENRY R. von ARX
KARL J. ZUEGER
BY A. C. Smith
ATTORNEY

SEMICONDUCTOR MATERIAL CUTTING APPARATUS AND METHOD OF MAKING THE SAME

BACKGROUND OF THE INVENTION

A plurality of integrated circuits of the same configuration are commonly produced on a single substrate or wafer of semiconductor material. The wafers must be separated into dice or pieces. The integrated circuit patterns are spaced apart from adjacent ones as a result of selectively indexed step and repeat masking techniques that are commonly used to form the circuit patterns over the entire surface of a semiconductor substrate. The individual circuits are separated out of the substrate using conventional scribing techniques which include using a hard tool to score the surface of the semiconductor substrate in the spaces between individual circuits, and then cracking or fracturing the substrate along the surface scores to yield the individual circuits on separate semiconductor dice.

One disadvantage encountered in using conventional scribing techniques to separate the individual circuits is that the semiconductor substrate is usually a brittle material such as silicon or gallium arsenide, or the like, which frequently fractures or cracks in other patterns than along the surface scores. Also, tiny surface fissures commonly occur which migrate from a surface score into a circuit pattern and destroy the operability of the circuit. More importantly, even where cracking or fracturing of the substrate only occurs along the surface scores, irregular edges are usually formed which cannot readily be used as reference surfaces to facilitate machine handling of the dice.

SUMMARY OF THE INVENTION

Accordingly, the semiconductor-material cutting apparatus of the present invention obviates the problems associated with scribing and fracturing of a substrate by removing the semiconductor material through the entire thickness of the substrate in the spaces between adjacent circuit patterns. This is accomplished in the present cutting apparatus using a rotatable wheel having one or more thin peripheral cutting edges formed of deposited nickel and diamond particles. Each cutting edge is formed according to the present invention by depositing several layers of dissimilar metals on a body and thereafter by removing a portion of the body to expose the cutting edge.

DESCRIPTION OF THE PREFERRED EMBODIMENT

Figure 1:
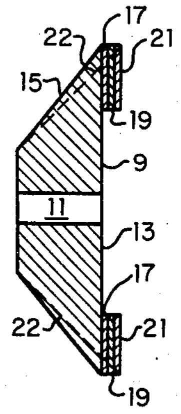
FIG. 1 is a side sectional view of the cutting wheel being formed in accordance with the present invention with the deposited layer near the periphery of the body.
Figure 2:
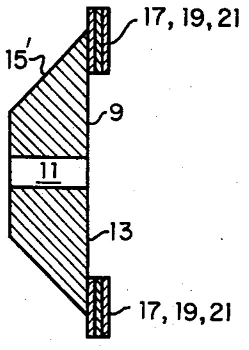
FIG. 2 is a side sectional view of the cutting wheel of FIG. 1 showing the peripheral edge of the body undercut adjacent the deposited layer.

Referring now to FIG. 1, there is shown a cross section of a circular wheel 9 having a central mounting hole 11, a planar reference face 13 and a tapered rear face 15. This portion of the wheel 9 may be made of aluminum or other suitable material and may be formed by conventional machine operations. After the body of the wheel 9 is formed, it may be cleaned using conventional chemical or mechanical means to remove any contaminants and oxides on the surface of the body 9. The surfaces of the body are then masked, leaving only an annular surface region near the periphery of the reference surface 13 exposed. Where aluminum is used as the body material, several commonly used preparatory process may be used prior to the formation of the desired layer of diamond particles in a nickel binder. Thus, a body of aluminum 9 may first be dipped in a solution containing a zinc compound such as zinc oxide, zinc sulfate, zinc fluoroborate (zincates, generally) to electrolytically plate zinc 17 onto the body 9 to a thickness of about 10 microinches in the unmasked annular region near the periphery. Next, a layer 19 of copper or nickel may then be electroplated onto the layer 17 of zinc to a thickness of about 100 microinches of less to form a base layer for the deposition of nickel and diamond particles.

The outer layer 21 of nickel and diamond particles is formed in the annular region near the periphery of body 9 by electroplating nickel from a plating solution containing a nickel compound such as nickel sulfamate, $Ni(SO_3NH_2)_2$, or nickel sulfate, or the like, and which minute diamond particles of the order of 4 to 6 microns size are suspended. In order to ensure substantially uniform distribution of diamond particles in the plated-up layer 21, the diamond particles are wetted by ultrasonically vibrating them in about a 9 percent solution of a commercial wetting agent such as "NH-5" (available from Harstan Chemical Corp., Brooklyn, New York) or other suitable wetting agents. These preparations of the diamond particles assure that the particles will not bunch up or adhere together in the plating solution and also assure that the surfaces of the particles may be thoroughly "wetted" by the nickel as it is plated up to form the layer 21.

The plating operation to form layer 21 includes connecting the body 9 to a source of negative potential to serve as a cathode and connecting an electrode of nickel immersed in the plating solution to a source of positive potential to serve as an anode. The difference of potential between the anode and cathode is typically about 4 to 6 volts. Also, the body 9 is arranged to be spun within the plating solution about the rotational axis of the body 9. A substantially constant low spin rate of about 12 revolutions per minute is maintained during the plating operation to assure a continuous flow of fresh plating solution at the surface of the cathode. Also, the body 9 may be periodically spun at a higher spin rate of about 300 revolutions per minute for about 5 to 10 seconds to spin off any bubbles of gas that are liberated at the surface of the cathode. Also, in order to ensure uniform distribution of diamond particles in the deposited layer 21, the plating solution with the diamond particles suspended therein is gently agitated and circulated about the body 9. Vigorous agitation or circulation of the solution is to be avoided, however, because diamond particles that initially come to rest on the upper surface of layer 21 must remain in situ as nickel is deposited from the solution over and about the particles to form the matrix of distributed diamond particles in a nickel binder within layer 21. Essentially no diamond particles come to rest on the lower surfaces of the body 9 during this plating-deposition operation which typically is continued until the layer 21 is approximately 0.001 inch thick with a diamond particle density of about 10 percent by weight compared with nickel. For the relative densities of diamond and nickel, this ratio constitutes about 25 percent by volume of diamond in the matrix. It should be understood, however, that these ratios of diamond and nickel in the matrix may vary about 20 percent without significantly altering the desirably properties or performance of the present cutting wheel. After the layer 21 is deposited to the desired thickness, any irregularities in the thickness of surface finish of the layer may be corrected using such light machining operations as surface lapping.

Figure 3:
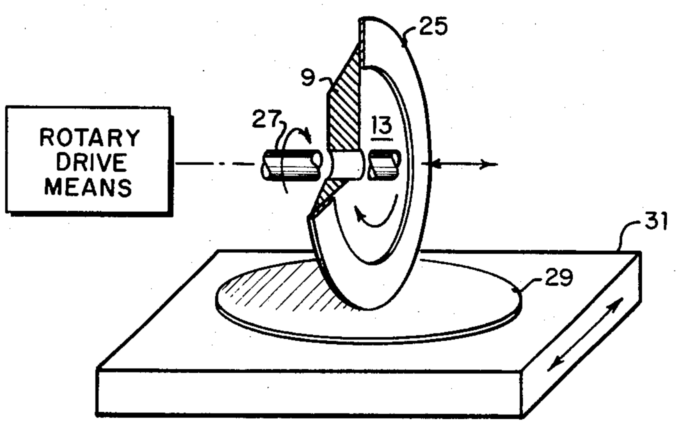
FIG. 3 is a perspective, quarter section view of a single wheel according to the present invention which is shown slicing a substrate.

After the layer 21 is deposited and machine-finished to a selected outside diameter, the rear face 15 of body 9 may then be machined as by making a bevel cut 22 to remove perimeter irregularities and plating layers on the back side of the body 9, as shown in FIG. 1. The body 9 is then etched in a solution of caustic soda to expose the back side of the outer region of the annular layers 17, 19 and 21. This etching of the body 9 may also remove the zinc layer 17 to expose the copper layer 19 which, if desired, may then be removed by next dipping the assembly into a commonly-known copper etching solution, thereby exposing both faces of the layer 21 of nickel and diamond particles, as shown in FIG. 3. However, since substantially only the outer periphery of the layer 21 is intended to cut, it may not be necessary to remove this copper layer. Thus, the cutting edge of the wheel is electroformed.

It has been determined that nickel is ideally suited for use as the binder for diamond particles in layer 21 because the internal stresses within a layer thus deposited are sufficiently low that no warping or twisting of the layer 21 is observed as the supporting body portion 23 is removed. The abrasive cutting edge 25 thus formed by layer 21 retains a high degree of dimensional stability with respect to the reference face 13 and may be held sufficiently rigid for cutting brittle semiconductor materials by spinning the wheel at very high rates of the order of 15 to 20 thousand revolutions per minute.

In operation, the cutting wheel of the present invention is mounted on a shaft 27 for rotation about the central axis above a workpiece 29 to be cut. The workpiece 29 may be a semiconductor wafer having a plural number of individual, separated integrated circuits formed thereon, which wafer is temporarily attached to a reference block 31. The cutting edge 25 of the present cutting wheel is aligned with respect to the spacing between rows or columns of integrated circuits to slice the wafer through its thickness. After several cuts in parallel directions, the individual semiconductor devices on wafer 29 are oriented on strips of semiconductor material. Thus, the wafer 29 is rotated to another angle with respect to the first cuts and again a series of parallel cuts are made along the spacings between the individual circuit elements. The individual elements are all neatly diced in this manner and the precision edges and corners thus formed are ideally suited for individual processing through machine-handled mounting, connecting and packaging operations.

Each cut or slice through a wafer 29 produced by the cutting wheel of the present invention has been found to be about 0.002 inch thick even though the layer 21 which forms the cutting edge is only about 0.001 inch thick and runs true without lateral wobbling at the high operating speeds. Although the mechanism by which the present wheel cuts through brittle semiconductor material such as silicon is not clearly understood, it is believed that the removed particles of the semiconductor material being cut contribute to the cutting process by serving as abrasive particles which aid in cutting the base and side walls of a slice or cut. This aids in relieving drag on the cutting edge within the cut or slice thus formed and tends to reduce wear on the cutting edge 25. For this reason, it has been found advantageous to move the wafer 29 in the same direction as the peripheral movement of the cutting edge 25 at the site of the slice or cut so that particles of the wafer 29 being removed in the cutting process are carried through the cut to aid in the cutting process in the manner as described above.

It has been determined that the present cutting wheel having a diamond particle density as described above, operating at about 15 thousand revolutions per minute, can slice through a 10 mil thick wafer of silicon at the rate of about one-quarter inch per second. In order to reduce greatly the time required at this cutting speed to dice up a wafer, the cutting wheel of the present invention may be formed with ganged cutting edges, as shown in the partial sectional view of FIG. 4. It should be understood that the ganged wheel of this embodiment is generally symmetrical about the center line or axis of revolution and has two or more cutting edges 21 axially spaced in multiples of the distances between the individual integrated circuits to be sliced out of a wafer. Thus, several different wheels may be required, each with different spacings 33 between cutting edges 21, in order to slice up wafers which contain integrated circuits thereon spaced apart by different dimensions. For unusual spacing dimensions between circuits on a wafer, several single wheels of the type shown in FIG. 3 may be stacked at the required spacing, or at multiples thereof, along a common rotatable shaft 27. In each case of spaced cutting edges, the actual spacing may be many multiples of the spacing between circuits on the wafer 29, such that the ganged wheel must be stepped along axially after each cut in order to from substantially evenly spaced slices in a wafer 29. The ganged wheels of FIG. 4 may be formed substantially as described above in connection with the single wheel of FIG. 3, except that plane-surface finishing of cutting edges 21, if required, may be accomplished using more elaborate machining techniques.

Figure 4:
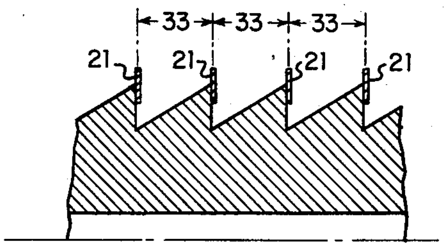
FIG. 4 is a partial sectional view of a ganged wheel in accordance with the present invention.
Figure 5:
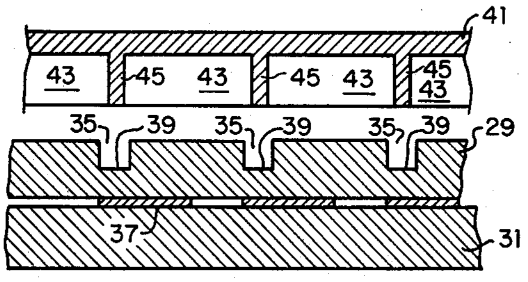
FIG. 5 is a sectional view of a cutting and handling operation for semiconductor dice in accordance with the present invention.

In operation, the single or ganged wheels of FIGS. 3 and 4 may be used to perform more precise processing steps than merely dicing up a wafer 29. A wafer 29 containing a plurality of spaced integrated circuits may be cut only partially through the thickness thereof from the back side, as shown in FIG. 5. These cuts 35 are aligned with the spacings between circuits formed on the reverse side of the wafer (or may be aligned with the ends of electrodes 37 that are disposed to form "-beam leads" for such circuits). Thereafter, while the wafer 29 is still temporarily attached to the reference block 31, the remaining portions 39 of the wafer beneath the cuts may be etched away, leaving the individual wafers separately attached to the reference block 31. Since the wafer material, typically silicon, is anisotropic and is usually oriented to etch more rapidly in the thickness dimension than in the lateral or diametrical dimension, the separations of the individual dice are completed before any substantial deterioration of the square edges and corners of the dice can occur. Thus, a tray 41 having partitions 43, 45 arranged thereon in the same layout and at the same spacings as the cuts 35 in the back side of the wafer 29 may be aligned over the individual dice with such partitions 43, 45 disposed within the cuts 35. Once the tray 41 and its partitions 43, 45 are so positioned, the assembly may be turned over and the reference block 31 removed from the dice (as by heating the block where the temporary adhesive is a wax, or the like, of conventional composition). This leaves the separated dice individually positioned within the partitioned compartments of tray 41 using only a minimum of manual labor for convenient subsequent machine-handling of the dice.

Therefore the cutting apparatus and the method of making and using the same according to the present invention provides precision cutting edges for accurate, high speed cutting and processing of semiconductor materials. Sharp-edged cuts in semiconductor materials thus produced provided convenient reference edges and corners on the dice for fast, inexpensive machine handling, mounting, connecting and packaging of individual semiconductor devices.

We claim:

1. Cutter apparatus comprising a rotatable body having a relatively thin surface near the periphery thereof which is substantially normal to the rotational axis of the body; and an electroformed unsupported layer of a matrix of diamond particles in a nickel binder disposed on said surface, said layer having substantially parallel sides protruding radially beyond the periphery of said body and forming a relatively thin homogeneous cutting blade.

2. Cutter apparatus as in claim 1 wherein said layer is approximately 1 mil thick.

3. Cutter apparatus as in claim 2 wherein the major radius of said layer is greater than the radius of the periphery of said body by at least 10 mils for cutting through such thickness of a material.

4. Cutter apparatus as in claim 1 wherein said electroformed layer is from nickel sulfamate bath.

* * * * *

Dedication 3,691,707.—*Henry R. Von Arx*, Palo Alto and *Karl J. Zueger*, San Rafael, Calif. SEMICONDUCTOR MATERIAL CUTTING APPARATUS AND METHOD OF MAKING THE SAME. Patent dated Sept. 19, 1972. Dedication filed Nov. 6, 1980, by the assignee, *Sola Basic Industries*.

Hereby dedicates to the Public the remaining term of said patent.

[*Official Gazette February 10, 1981.*]